United States Patent

Carr

[19]

[11] Patent Number: 4,598,260
[45] Date of Patent: Jul. 1, 1986

[54] EDDY CURRENT PROXIMETER

[75] Inventor: William W. Carr, Phoenix, Ariz.

[73] Assignee: Transducer Limited Partnership, Tempe, Ariz.

[21] Appl. No.: 601,430

[22] Filed: Apr. 18, 1984

[51] Int. Cl.[4] .............................................. H03B 5/20
[52] U.S. Cl. ................................... 331/135; 324/222; 324/236; 331/65; 331/117 R
[58] Field of Search ............... 324/207, 222, 236, 327; 331/65, 117 R, 135, 136, 137, 167

[56] References Cited

U.S. PATENT DOCUMENTS

| | | | |
|---|---|---|---|
| 3,883,796 | 5/1975 | Holt et al. | 324/236 |
| 4,095,469 | 1/1978 | Yamada et al. | 324/222 X |
| 4,310,807 | 1/1982 | McKee | 331/167 X |
| 4,414,541 | 11/1983 | Ho | 331/65 X |

Primary Examiner—Eugene R. LaRoche
Assistant Examiner—James C. Lee
Attorney, Agent, or Firm—Drummond & Nissle

[57] ABSTRACT

An inductive sine wave oscillator circuit for an eddy current proximeter. The oscillator circuit includes an operational amplifier and a coil. The frequency and amplitude of the output signal produced by the circuit varies with and is controlled by the inductance of the coil. The circuit signal input to the operational amplifier undergoes a phase shift as the signal passes through the amplifier. One advantage of the oscillator circuit is that the frequency and amplitude of the output signal of the circuit for a coil having a particular inductance remains relatively stable and constant when the operating temperature of the coil varies. In addition, the coil can be fabricated from a material having a relatively high electrical resistivity.

2 Claims, 9 Drawing Figures

EDDY CURRENT PROXIMETER

BACKGROUND OF THE INVENTION

1. Field of the Invention

This invention relates to oscillator circuits.

More particularly, the invention relates to an inductive sine wave oscillator circuit which includes an operational amplifier and in which the frequency and amplitude of the output signal produced by the circuit varies with and is controlled by the inductance of a coil in the circuit.

In a further respect, the invention relates to an oscillator circuit of the general type described in which the signal that is input to the amplifier undergoes a phase shift as the signal passes through the amplifier.

In another respect, the invention relates to an oscillator circuit of the general type described in which the frequency and amplitude of the output signal for a particular inductance of the coil remains relatively stable and constant while the operating temperature of the coil varies.

In yet still another aspect, the invention relates to an oscillator circuit of the type described in which the coil can be formed from a material having a relatively high electrical resistivity.

2. Description of the Related Art

Oscillators convert direct current to alternating current or other forms of pulsating direct current. The waveforms can be sine wave, square wave, triangle wave, sawtooth wave, or other combinations of these basic wave types. Sine wave oscillators require positive feedback and resistor-capacitor (RC) or inductor-resistor (LR) components. Positive feedback occurs when a portion of the oscillator output signal is fed back to the input of the oscillator and is in phase with the input signal. Conventional oscillators include the RC phase-shift oscillator, Wein bridge oscillator, Armstrong oscillator, Hartley oscillator, Colpitts oscillator, Clapp oscillator, and crystal oscillator.

A Colpitts oscillator produces a sine wave output and includes an LC tank circuit. Colpitts oscillators are often utilized in eddy current proximity measuring transducers, termed PMT's for short. When a Colpitts oscillator is utilized in a PMT, the probe coil of the PMT functions as the inductive element in the LC tank circuit. Varying the distance of the probe coil from an electrically conductive target material varies the inductance and resistance of the coil and consequently varies the amplitude of the output signal. In particular, when the probe coil is positioned proximate a metal, "eddy" current is induced in the metal. The eddy current absorbs power from the LC tank circuit of the oscillator, reduces the loop gain of the oscillator, and reduces the output voltage of the oscillator.

Conventional Colpitts oscillator PMT's utilize an inductive coil which has a high Q value where Q is equal to wL/R and $$w = 2 \times 3.14 \times \text{frequency}$$

L = coil inductance
R = coil resistance

Thus, to obtain a high Q value, the probe coil must have a high inductance L and be fabricated from a material having a low electrical resistance R. The operating frequency w must also be high. A low resistance inductive coil can be obtained by utilizing a copper or silver wire. The principal disadvantage of copper and silver coils is that the electrical resistance of copper and silver markedly increases with temperature, causing the output signal of the oscillator to vary with temperature as well as with the distance of the probe coil from an electrically conductive target material. The unwanted variation of the output signal with temperature can be somewhat compensated for by adjusting the operating frequency of the coil. Another procedure for compensating for temperature related alterations in coil resistance is to design the coil so that inductance of the coil increases when coil resistance increases. However, both this technique and the technique of adjusting coil frequency may not accurately compensate for changes in coil resistance concomitant with variation in the operating temperature of the coil.

Another drawback associated with attempting to compensate for PMT coil wires having temperature sensitive resistance characteristics is that the frequency utilized to operate the probe coil and oscillator must be high, often in excess of six hundred kilohertz. Also, since the operating frequency of the oscillator is dictated by the conditions necessary to compensate for temperature related resistance changes of the coil, it is generally not possible to select an operating frequency for a PMT which would provide optimal performance of the induction coil with respect to a particular electrically conductive target material.

Accordingly, it would be highly desirable to provide an improved inductive oscillator circuit in which the output signal varies with the inductance of a coil in the circuit and in which the inductive coil consists of a material having a resistance which remains relatively constant when the operating temperature of the coil varies.

It would also be highly desirable to provide an improved inductive oscillator circuit which would, when utilized in a proximity measuring transducer (PMT), permit the operating frequency of the PMT to be readily adjusted to obtain optimal operating conditions for the probe coil with respect to a particular electrically conductive target material.

Therefore, it is a principal object of the invention to provide an improved inductive oscillator circuit.

Another object of the invention is to provide an improved inductive oscillator circuit having a sine wave output which varies with the inductance of an inductive component in the circuit, the inductive component being comprised of a material having an electrical resistance which remains relatively constant when the operating temperature of the inductive component varies.

A further object of the invention is to provide an improved oscillator circuit which, when utilized in a proximity measuring transducer, facilitates adjustment of the operating frequency of the PMT to obtain optimal operating parameters for the PMT in relation to an electrically conductive target material.

BRIEF DESCRIPTION OF THE DRAWINGS

These and other, further and more specific objects and advantages of the invention will be apparaent to those skilled in the art from the following detailed description thereof, taken in conjunction with the drawings, in which.

SUMMARY OF THE INVENTION

Briefly, in accordance with my invention, I provide an improved inductive oscillator circuit. The circuit includes a phase-shift amplifier having an output and an input, the input including a positive input terminal and a negative input terminal; first positive feedback means connecting the amplifier output to the amplifier positive input terminal; second negative feedback means connecting the amplifier output to the amplifier negative input terminal; inductive means including first resistor means; means connecting the inductive means to the positive input terminal as part of the first feedback means to produce a signal at the input which is variable in accordance with the inductance of the inductive means, the inductive means causing a phase shift in the voltage signal traveling through the first feedback means from the output to the input; second resistor means in the first positive feedback means; and, third resistor means in the second negative feedback means. The resistance of the first resistor means is preferably from twenty to five hundred ohms.

Figure 1:
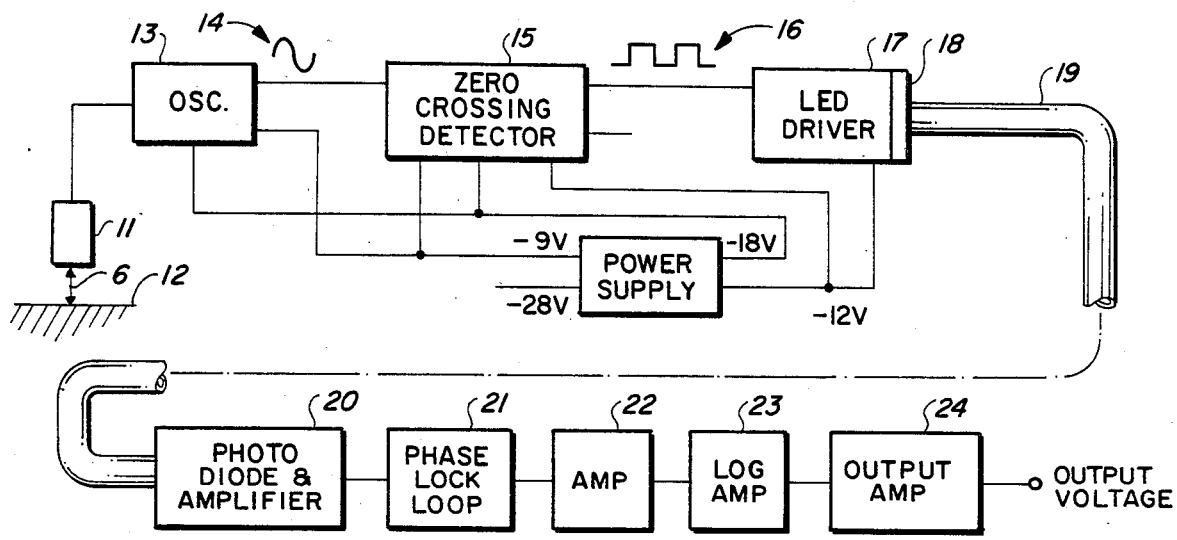
FIG. 1 is a schematic diagram illustrating an eddy current proximeter which includes an inductive oscillator circuit constructed in accordance with the invention.

Turning now to the drawings, which depict the presently preferred embodiments and best mode of the invention for the purpose of illustrating the practice thereof and not by way of limitation of the scope of the invention, and in which identical reference characters correspond to like elements through the several views, the schematic flow diagram of FIG. 1 illustrates a proximity measuring transducer which indicates the distance from probe 11 to an electrically conductive target material 12. Probe 11 includes an inductive coil having a relatively high resistance, preferably in the range of twenty to five hundred ohms. Probe 11 is connected to the input of oscillator 13. Oscillator 13 produces a sine wave output 14 transmitted to zero crossing detector 15 which produces square wave 16. The frequency and amplitude of output sine wave 14 are modulated by the distance of probe 11 from target 12. Zero crossing detector 15 removes the amplitude component from output signal 14. LED driver 17 includes a transistor which drives LED 18. Light from LED 18 is transmitted through fiber optic cable 19 to photo diode and amplifier 20. Photo diode 20 converts the light signal from cable 19 into an electrical current. Wide band amplifier 20 converts the electrical current into a voltage signal. The voltage output of amplifier 20 is applied to and received by phase lock loop circuit 21. Phase lock loop circuit 21 demodulates the frequency modulated voltage signal from amplifier 20. The output of the phase lock loop circuit 21 is amplified and level shifted by amplifier 22. The output of amplifier 22 is applied to the input of logarithmic amplifier 23 which linearizes the input voltage from amplifier 22. Log amplifier 23 is utilized because the frequency of output voltage signal 14 does not vary linearly with the distance of probe 11 from target 12 but instead tends to vary exponentially with the distance of probe 11 from target 12. Hence logarithmic amplifier 23 is a simple way of obtaining a linear indication of the distance from probe 11 to electrically conductive target 12. Output amplifier 24 amplifies the output signal of log amplifier 23.

Figure 2:
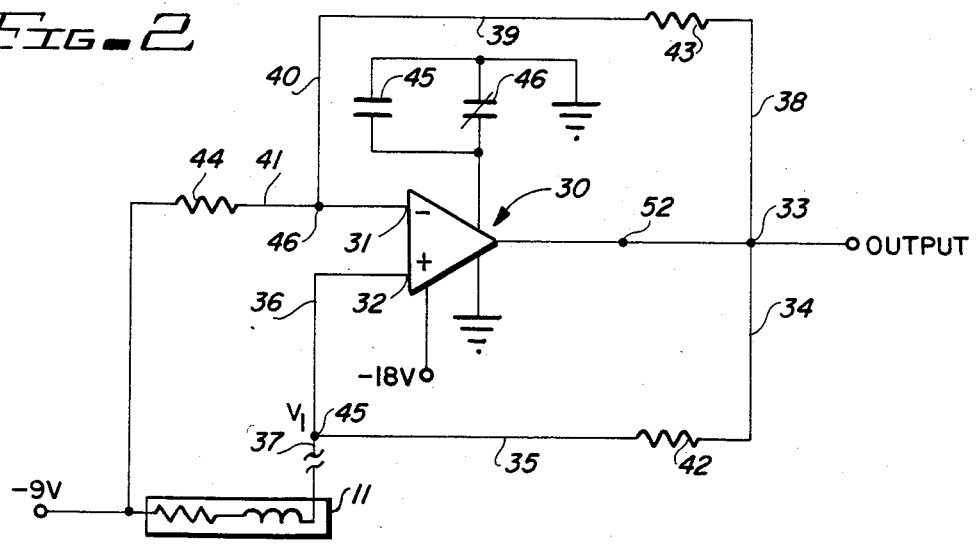
FIG. 2 is a schematic diagram of the presently preferred embodiment and best mode of the oscillator circuit of the invention.

The presently preferred embodiment and best mode of the oscillator of the invention is illustrated in FIG. 2 and includes amplifier 30 having negative input terminal 31 and positive input terminal 32. Positive and negative input terminals 32, 31 are also known as noninverting and inverting terminals, respectively. Amplifier 30 has an output connected to terminal 33. The oscillator circuit has negative and positive feedback means connecting the output 33 of amplifier 30 with negative and positive input terminals 31, 32, respectively. The negative feedback means includes arms 38-41. The positive feedback means includes arms 34-37. Arm 35 includes resistor 42. Probe 11 is included in arm 37 and, because probe 11 comprises a coil made from a material having a relatively high electrical resistance, represents an inductance and resistance network where the inductance and resistance are connected in series. Arm 37 coaxial cable usually connects probe 11 to the input of amplifier 30. Arm 39 includes resistor 43 while arm 41 includes resistor 44. Capacitor 45 and variable capacitor 46 are used to adjust the oscillation frequency of the circuit and are connected to frequency control terminals of amplifier 30.

In one circuit constructed in accordance with the invention, resistor 44 is 680 ohms, resistor 43 is 4220 ohms, resistor 42 is 3,300 ohms, the inductance of probe 11 is 270 microhenries, the resistance of probe 11 is 450 ohms and a Harris HA-2620 amplifier is utilized as amplifier 30. The Harris HA-2620 amplifier has a phase shift of 90° for open loop frequencies of one kHz to 1 MHz, and has a high gain in the range of 80 to 150 dB. The inductor coil of probe 11 is presently fabricated from an alloy wire which is 50% copper and 50% nickel. Such wire is sold commercially under the CONSTANTAN trademark. CONSTANTAN wire has a relatively high electrical resistance and has a low temperature coefficient of resistance.

Frequency control capacitor 46 is adjusted so that the oscillator circuit of FIG. 2 will oscillate at a frequency of about 120,000 Hz when probe 11 is not near a target 12. Capacitors 45, 46 control the frequency of the circuit because they control the gain band width product. The gain band width product equals the open loop gain of amplifier 30 times the bandwidth of amplifier 30. The circuit of FIG. 2 will function without capacitors 45, 46. However, since the electrical properties of each HA-2620 amplifier varies somewhat from other HA-2620 amplifiers, different HA-2620 amplifiers will, without the frequency adjustment control afforded by capacitors 45, 46, oscillate at differing frequencies. Capacitors 45, 46 permit each oscillator circuit utilizing an HA- 2620 amplifier to be adjusted to oscillate at an identical desired frequency when probe 11 is an "infinite" distance from target 12, i.e., when probe 11 is not near enough target 12 to induce eddy current in target 12. If each oscillator circuit constructed in accordance with FIG. 2 oscillates at the same frequency, then equivalent variations in the frequency and amplitude of the output signal 33 of each circuit will indicate an equivalent variation in the inductance of probe coil 11.

When the output of the oscillator circuit of FIG. 2 increases, the amplitude of the output increases and the frequency decreases. When the output of the circuit decreases, the amplitude of the output signal decreases and the frequency increases. The output of the oscillator circuit of FIG. 2 increases when probe 11 is moved closer to a target of magnetic metal. The output of the circuit decreases when probe 11 is moved nearer a non-magnetic metal target.

The loop gain of the oscillator circuit of FIG. 2 equals one. The overall frequency phase shift of the loop gain is zero degrees.

Since the oscillator circuit of the invention utilizes a probe coil 11 having an unusually high resistance and a low temperature coefficient of resistance, the temperature sensitivity of the coil is minimized and a circuit having a low Q value is obtained. In order to overcome the high losses which occur in utilizing a high resistance coil 11, the amplifier utilized in the oscillator of the invention must exhibit a high gain and also exhibit a phase shift in the range of 70 to 90 degrees. The high gain and phase shift of the amplifier enable the circuit to oscillate.

Adjusting the distance of probe 11 from a target 12 or otherwise adjusting the inductance and resistance of probe 11 modulates the frequency and amplitude of the output signal 33. Output signal 33 can be processed as indicated in FIG. 1 to evaluate the frequency modulation of signal 33 with variation in the inductance and resistance of probe 11, or, signal 33 can be processed in a manner similar to that explained in my copending application Ser. No. 284,250, filed July 17, 1981, to evaluate amplitude modulation of output signal 33 which occurs with variation in the inductance and resistance of probe 11.

The oscillator circuit of FIG. 2 is best described as a phase shift type oscillator because oscillations are produced and sustained in the circuit as the result of the phase shift which occurs in probe 11 and as the result of the 90° phase shift of amplifier 30. Probe 11 produces a phase shift because probe 11 includes resistance and reactance values.

Figure 3:
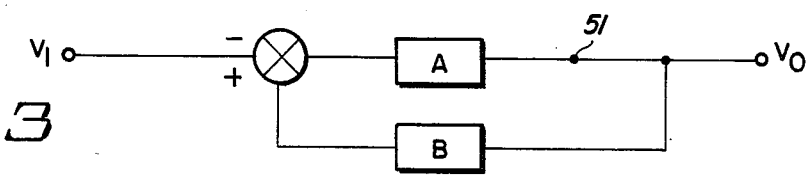
FIG. 3 is a schematic diagram of an oscillator circuit utilized in the development of the Barkhausen Criteria.

Phase shift oscillators can be analyzed using the Barkhausen Criteria. FIG. 3 depicts a circuit including amplifier 50 having gain A, an input voltage $V_i$, an output voltage $V_o$, and a feedback element B. The closed loop voltage gain K of the system of FIG. 3 is $$K = V_o/V_i = A/(1-AB)$$

The denominator value of $1-AB$ is called the characteristic equation or CE for short. According to the Barkhausen Criteria a stable oscillator results when $$1-AB=0$$

If $$1-AB=0,$$

then $$AB=1.$$

Figure 4:
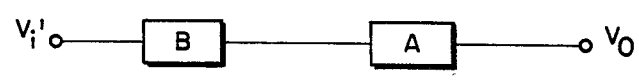
FIG. 4 is a schematic diagram of the circuit resulting when in the circuit of FIG. 3 $V_i$ is set to zero and the circuit rearranged.

AB is termed the loop gain of the amplifier system. If the circuit of FIG. 3 is broken at point 51 and voltage $V_i$, which is zero, is set to $V_i'$ the circuit of FIG. 4 results. In FIG. 4 $V_i'$ is a hypothetical input voltage, 50 is the amplifier, B is the feedback element and $V_o$ the output voltage. The loop gain of the system of FIG. 4 is equal to AB where $$AB=V_o/V_i'$$

If $$AB=1,$$

then the circuit of FIG. 3 will oscillate. In general, either A or B or both will be a complex number and their product will be a complex number:

$$AB=x+jy$$

Since AB must equal one for oscillation to occur in a circuit, there must, practically speaking, be a way to make $$y=0$$

and $$x=1.$$

DESCRIPTION OF THE PREFERRED EMBODIMENTS

Figure 5:
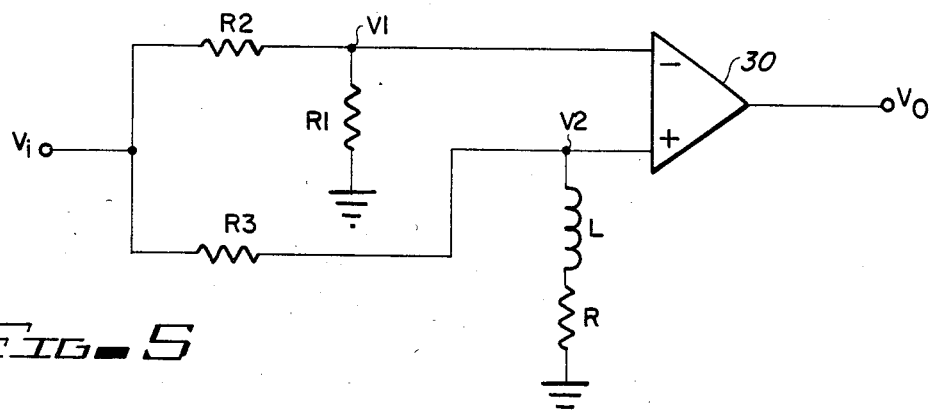
FIG. 5 is a schematic diagram of the oscillator circuit of FIG. 2 after the circuit has been rearranged for analysis under the Barkhausen Criteria.

The circuit of FIG. 2 can be analyzed utilizing the Barkhausen Criteria. In the following analysis R1, R2, and R3 represent resistors 44, 43 and 42, respectively; L and R represent the inductance and resistance of probe 11; $A_{OL}$ is the open loop gain of amplifier 30; and C1 is the capacitance of the circuit including capacitors 45, 46. To begin with, C1 is neglected, and the circuit is broken at point 52 and rearranged slightly to give the circuit illustrated in FIG. 5, where $V_i$ is a hypothetical input voltage and $V_o$ is the resulting output voltage. V1 and V2 are the voltages at the points indicated in FIG. 5. The gain $V_o/V_i$ for the circuit of FIG. 5 is equivalent to the loop gain AB discussed earlier in outlining the Barkhausen Criteria. Amplifier 30 is assumed to be a differential amplifier having a voltage gain of $A_{OL}$ where $A_{OL}$ represents the amplifier open loop gain. From the circuit of FIG. 5:

$$V_O=(V2-V1)A_{OL}$$

But $$V1=V_i[R1/(R1+R2)]$$

and $$V2=(R+jWL)/(R3+R+jWL)$$

where $$W=2\times3.14\times\text{frequency},$$

and $j$ = the square root of $(-1)$.
Letting $$R1/(R1+R2)=D,$$

we then have the equation $$V_O = V_i[(R+jWL)/(Re+R+jWL)-D]A_{OL}.$$

Dividing by $V_i$, the loop gain AB is $$AB=[(R+jWL)/(R3+R+jWL)-D]A_{OL}.$$

Since the Barkhausen Criteria states that AB must equal one, the equation for oscillation is $$1=[(R+jWL)/(R3+R+jWL)-D]A_{OL} \qquad [1]$$

Letting $$a=R3+R$$

and $$jWL=jb$$

Equation [1] becomes $$1=[(R+jWL)/(a+jb)-D]A_{OL}. \qquad [2]$$

Equation [2] must be broken into its real and imaginary parts and the imaginary part set equal to zero and the real part set equal to one. Taking the following term from Equation [2]

$$(R+jWL)/(a+jb)$$

multiplying the numerator and denominator by $(a-jb)$, separating the result into real and imaginary parts, and substituting the result into Equation [2] gives $$[(aR+bWL)/(a^2+b^2)]+j[(aWL-jbR)/(a^2+b^2)]$$

Substituting this into Equation [2] we obtain $$1[(aR+bWL)/(a^2+b^2)-D+j(aWL-bR)/(a^2+b^2)]A_{OL} \qquad [3]$$

Figure 6:
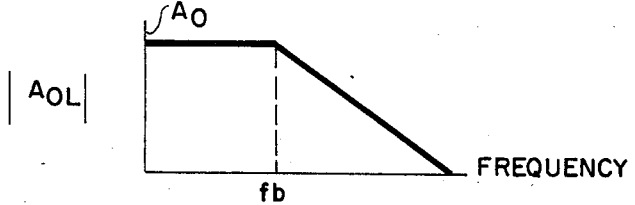
FIG. 6 is a graph illustrating the variation of open loop gain of an operational amplifier with frequency.

In a commercially available integrated circuit operational amplifier with internal frequency compensation, the gain $A_{OL}$ is:

$$A_{OL}=A_o/(1+jf/fb)$$

where $A_o$ is the gain at zero frequency, fb is called the break frequency, f is the operating frequency and j is the square root of minus one. The value of $A_o$ is normally large, on the order of 100,000. The value of fb depends on the type of amplifier utilized. A graph illustrating the variation of $A_{OL}$ with frequency is shown in FIG. 6. The graph of FIG. 6 is called a Bode plot. An essential feature of the integrated circuit operational amplifier used in the oscillator of the invention is that fb must be large. The HA-2620 amplifier or an equivalent thereof fulfills this requirement.

Capacitance C1 of the circuit of FIG. 2 determines the break frequency fb. Thus adjusting capacitance C1 adjusts the operating frequency of the oscillator. Since $$A_{OL}=A_o/(1+jf/fb),$$

this equivalent for $A_{OL}$ can be substituted into Equation [3] above. Assuming that the preferred frequency of the oscillator circuit is around 100,000 cycles per second, fb is around 100 cycles per second. Thus $$f/fb=100$$

and, $jf/fb$ is much greater than one. This permits Equation [3] to be written $$1=[(aR+bWL)/(a^2+b^2)-D+j(aWL-bR)/(a^2+b^2)]A_o/(jf/fb)$$

Dividing the j term associated with the $A_o$ expression into the terms in the brackets and inverting f/fb gives $$1=[-j[(aR+bWL)/(a^2+b^2)-D]+(aWL-bR)/(a^2+b^2)]A_ofb/f \qquad [4]$$

Since Equation [4] must equal one, the imaginary part must equal zero and the real part equal one. This means $$D=(aR+bWL)/(a^2+b^2) \qquad [5]$$

$$1=[(aWL-bR)/(a^2+b^2)]A_ofb/f \qquad [6]$$

But $$a=R3+R$$

$$b=WL$$

Substituting these values into Equations [5] and [6], $$D=[(R3+R)R+W^2L^2]/[(R3+R)^2+W^2L^2] \qquad [7]$$

$$1=[[(R3+R)WL-WLR]/[(R3+R)^2+W^2L^2]]A_ofb/f \qquad [8]$$

Equations [7] and [8] are used to design a particular oscillator circuit. All the quantities in the two equations are known except for D and R3. Since there are two unknowns D and R3 and two equations, the two equations are solved simultaneously for D and R3. In the equations $$W=2\times3.14\times f$$

where f is the desired operating frequency; L and R are the inductance and resistance of probe 11; $A_o$ is obtained from the data sheet of the operational amplifier 30 being utilized; and, fb is approximated. $A_o$ is typically assigned a value of from 80,000 to 150,000.

Since C1 controls the value of fb, the product of $A_ofb$ in Equation [8] can be kept constant by appropriately varying C1 to compensate for differences in $A_o$. In FIG. 2 variable capacitor 46 is provided so the oscillator circuit can be tuned to the desired operating frequency.

Equations [7] and [8] can be employed to demonstrate how the oscillator of FIG. 2 can be utilized as a proximity detector. Equation [8] can be rewritten $$(R3+R)^2+W^2L^2=[(R3+R)L-LR]6.28A_ofb$$

Substituting the left hand side of this rewritten equation into Equation [7] and solving for the operating frequency f gives $$f=[1/6.28L][6.28A_ofb(R3)LD-R(R3+R)]^{0.5} \qquad [9]$$

When probe 11 is positioned proximate an electrically conductive material, L and R change, causing a shift in the frequency and amplitude of the output signal. Since both the frequency and amplitude of the output signal vary with the inductance of probe 11, either the frequency or amplitude can be monitored to evaluate the distance of probe 11 from an electrically conductive target material.

Figure 7:
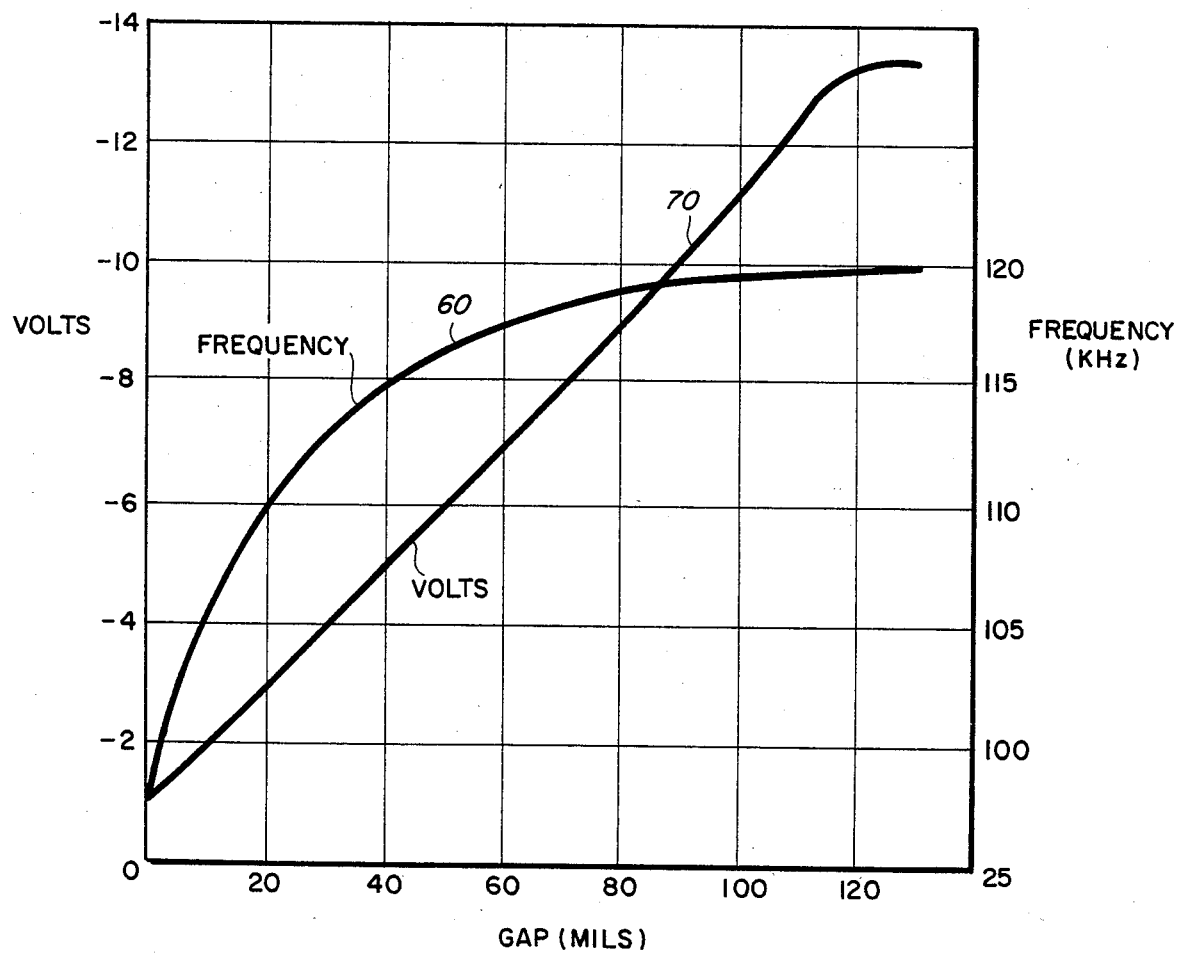
FIG. 7 is a graph illustrating frequency—gap and voltage—gap curves obtained utilizing a proximity detector which includes an oscillator circuit constructed in accordance with the principles of the invention.

The graph of FIG. 7 illustrates the variation of output frequency at 33 resulting from variation in the gap distance G (FIG. 1) between probe 11 and conductive target 12. This frequency-gap curve 60 of FIG. 7 was obtained utilizing the system of FIG. 1. The system included an oscillator circuit constructed in accordance with FIG. 2 and had the component values described herein. The straight line 70 in the graph of FIG. 7 represents the variation in output voltage with concomitant variation in the gap distance G. The frequency-gap curve of FIG. 7 closely approximates an exponential curve. This explains why, in FIG. 1, a logarithmic amplifier 23 is utilized. Log amp 23 facilitates generation of linear voltage versus gap curve 70. An ICL 8048 logarithmic amplifier was utilized as log amplifier 23 in FIG. 1. An NE565 phase lock loop circuit was utilized as phase lock loop 21. An MC1710 was utilized as zero crossing detector 15 which receives the sine wave output from oscillator 13 and produces square wave 16. Square wave 16 drives the LED driver 17. Zero crossing detector 15 also removes the amplitude information from output signal 14 of oscillator 13 and permits the frequency component of the signal to pass as square wave 16.

As earlier noted, the oscillator circuit which was built to test the invention included a probe coil 11 having an inductance L of 270 microhenries and a resistance R of 450 ohms. The value of R3 (resistor 42 in FIG. 2) was 3300 ohms and the operating frequency of the oscillator circuit was 100,000 to 120,000 Hz, with 120,000 Hz being the frequency when probe 11 is not positioned near metal target 12. These component values can be substituted in Equation [1] above to demonstrate that the circuit of FIG. 2 can oscillate with a temperature stable low Q coil. Since $$A_{OL} = A_o / (1 + jf/fb)$$

the right hand portion of the above equation can be substituted into Equation [1]. After this substitution for $A_{OL}$, and after the values for R3, L, R, and W are inserted, Equation [1] is solved for $A_o fb$. Assuming that f has a value of 100,000 Hz, the value of $A_o fb$ obtained is $3.22 \times 10^6$. This means operational amplifier 30 utilized in the circuit of FIG. 2 must have a gain bandwidth product of at least $3.22 \times 10^6$ in order for the circuit to oscillate. $A_o$ cannot be controlled. However, C1 permits fb to be controlled to obtain the desired gain bandwidth product. The Q value for a circuit utilizing the component values for R, L and f noted above would be only 0.301.

One of the principal advantages of the oscillator circuit of the invention is that it can be utilized with a probe 11 having an inductive coil with a low Q value, where $Q = wL/R$. In the practice of the invention it is preferred that the Q value of the inductive coil of probe 11 be in the range of 0.1 to 5.0. The inductance of the coil of probe 11 is presently generally in the range of 25 to 350 microhenries.

The following analysis further explains the role of operational amplifier 30 (FIG. 2) in the oscillator circuit of the invention.

Figures 8, 9:
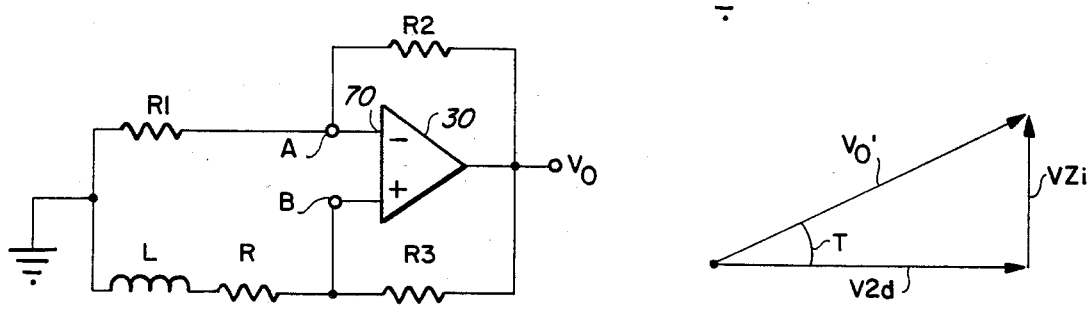
FIG. 8 is a schematic diagram of the oscillator circuit of the invention.
FIG. 9 is a phasor diagram of the voltage at point B in the circuit of FIG. 8.

The oscillator circuit of the invention can be represented as shown in FIG. 8. In the circuit of FIG. 8 $V_o$ is a sine wave and can be mathematically defined:

$$V = V_p \sin(wt) \quad [10A]$$

V1 is the voltage at point A in FIG. 8 while V2 is the voltage at point B. V1 and V2 are also in sine wave form and each has the same frequency. The phase of V1 may be shifted with respect to voltage V2, i.e., V1 may be out of phase with respect to voltage V2. Mathematically:

$$V1 = V1_p \sin(wt + T1) \quad [10B]$$

$$V2 = V2_p \sin(wt + T2) \quad [10C]$$

Since voltages $V_o$, V1, V2 are sine waves they can be expressed $$V_o = V_p \underline{/0°} \quad [10D]$$

$$V1 = V1_p \underline{/T1}$$

$$V2 = V2_p \underline{/T2}$$

In FIG. 8, R1 and R2 comprise a voltage divider and $$V1 = V_o R1/(R1 + R2)$$

If $$d = R1/(R1 + R2)$$

then $$V1 = V_o d \quad [10E]$$

Equation [10E] means that if an oscilloscope is connected at point A in FIG. 8 and the voltage V1 is measured with respect to ground, the measured voltage would be exactly in phase with $V_o$ and would be attenuated by an amount represented by d. d is less than one.

In the positive input portion of the circuit of FIG. 8, R, R3, and L also comprise a voltage divider and $$V2 = [V_o(R + jwL)] / [(R1 + R3) + jwL]$$

The presence of inductance L causes V2 to be a complex number:

$$V2 = [V_o M_n \underline{/T_n}] / M_d \underline{/T_d} \quad [11]$$

where $$M_n = [R^2 + (wL)^2]^{0.5}$$

$$M_d = [(R + R3)^2 + (wL)^2]^{0.5}$$

$$T_n = \arctan(wL/R)$$

$$T_d = \arctan[wL/(R + R3)]$$

Since (R + R3) is greater than R, $T_d$ is less than $T_n$. Also $M_d$ is greater than $M_n$.

In complex number theory, when one complex number is divided by another, the magnitudes divide and the phase angles are subtracted from one another. Equation [11] is therefore written $$V2 = V_o(M_n/M_d)\underline{/T_n - T_d} \quad [12]$$

If $$M = (M_n/M_d)$$

and $$T = T_n - T_d$$

then equation [12] becomes $$V2 = V_o M \underline{/T} \quad [13]$$

$T_d$ is less than $T_n$, so T is positive. $M_d$ is greater than $M_n$, so M is less than one.

Letting $$V_o' = V_o M$$

Equation [13] becomes $$V2 = V_o'\underline{/T} \quad [14]$$

Equation [14] means V2 is some voltage $V_o'$ which is phase shifted by the angle T. V2 can be represented by the phasor diagram shown in FIG. 9 of the drawings. In FIG. 9:
V2d = the real part of V2
V2i = the imaginary part of V2

$$V2d = V_o' \sin T$$

$$V2i = V_o' \cos T$$

Writing a complex number in the manner of equation [14] is called writing a complex number in polar form. Equation [14] can be written in rectangular form:

$$V_2 = V_o' \sin T + jV_o' \cos T$$

But $$V2d = V_o' \sin T$$

$$V2i = V_o' \cos T$$

So $$V_2 = V2d + jV2i$$

In FIG. 8, $V_o$ for operational amplifier 30 is $$V_o = (V2 - V1)A_{OL} \quad [15]$$

where $A_{OL}$ is the open loop gain of amplifier 30. The open loop gain can be expressed $$A_{OL} = A_o/[1 + j(w/wb)]$$

$$= A_o/j(w/wb)$$

and equation [15] becomes $$V_o = (V2 - V1)A_o/j(w/wb)$$

But $$-j = 1/j$$

So $$V_o = -j(V2 - V1)A_o(wb/w)$$

At the operating frequency of the circuit of FIG. 8, w equals the operating frequency and $A_o$ and wb are constants. Thus, at the operating frequency $$K = A_o wb/w$$

and $$V_o = -jK(V2 - V1) \quad [16]$$

Equation [16] means that the output voltage $V_o$ equals the difference between input voltages V1 and V2 multiplied by a constant K and that $V_o$ is minus ninety degrees out of phase with the difference between the input voltages. V1 has no phase shift associated with it and $$V1 = V_o d$$

V2 has a phase shift which is expressed $$V2 = V_o' \angle T$$

$$= V2d + j(V2i)$$

$V_o$ can be written $$V_o = -j(V2d + jV2i - V1)K$$

If V1 is equal to V2d $$V_o = -jK(jV2i)$$

But $j \times (-j) = 1$, so $$V_o = (V2i)K \quad [17]$$

Equation [17] means there is no phase shift between $V_o$ and V2i.

In sum, during operation of the oscillator circuit of FIG. 8,
1. The inverting (negative) input 70 is used to cancel the real part of the complex impedance on the noninverting (positive) input 80.
2. The minus ninety degree phase shift of operational amplifier 30 offsets the plus ninety degree phase shift of the imaginary part of the impedance on the noninverting (positive) input 80 giving a net phase shift of zero degrees.
3. The high gain of the operational amplifier 30 multiplies the magnitude of the imaginary part of the impedance on the noninverting (positive) input 80. The magnitude of the imaginary part of the impedance of input 80 is normally small, therefore the gain must be large. The gain must be large because in the circuit of the invention the product of the gain times the imaginary part of the impedance of input 80 must equal, or nearly equal, one.

As will be appreciated by those of skill in the art:
1. In equation [10A]:
$w = 2 \times 3.14 \times$ frequency
$t =$ time
$V_p =$ peak voltage 2. In equation [10B]:
   $V1_p$ = peak voltage
   $w = 2 \times 3.14 \times$ frequency
   $t$ = time
   $T1$ = phase angle between output and input
3. In equation [10C]:
   $V2_p$ = peak voltage
   $w = 2 \times 3.14 \times$ frequency
   $t$ = time
   $T2$ = phase angle between output and input
4. In equation [11]:
   $M_n$ = magnitude of numerator
   $M_d$ = magnitude of denominator
   $T_n$ = phase angle
   $T_d$ = phase angle Having described my invention in such terms as to enable those skilled in the art to understand and practice it, and having identified the presently preferred embodiments thereof,

I claim:

1. An inductive oscillator circuit including
   a. a amplifier having a phase shift and an output and an input, said input including a positive input terminal and a negative input terminal;
   b. first positive feedback means connecting said amplifier output to said amplifier positive input terminal;
   c. second negative feedback means connecting said amplifier output to said amplifier negative input terminal;
   d. inductive means including first resistor means;
   e. means connecting said inductive means to said first feedback means to produce a signal at said positive input terminal which is variable in accordance with the inductance of said inductive means, said inductive means causing a phase shift in said voltage signal traveling through said first feedback means from said output to said positive input terminal;
   f. second resistor means in said first positive feedback means; and
   g. third resistor means in said second negative feedback means;
   said phase shift of said amplifier enabling
   h. said phase shift in said voltage signal traveling through said first feedback means; and,
   i. oscillation to occur in said circuit.

2. The oscillator circuit of claim 1 wherein the resistance of said first resistor means is from one hundred and fifty to five hundred ohms.

* * * * *